(12) United States Patent
Inoue

(10) Patent No.: US 6,813,022 B2
(45) Date of Patent: Nov. 2, 2004

(54) INTERFEROMETER SYSTEM

(75) Inventor: Fuyuhiko Inoue, Kanagawa-ken, CA (US)

(73) Assignee: Nikon Corporation, Tokyo (JP)

( * ) Notice: Subject to any disclaimer, the term of this patent is extended or adjusted under 35 U.S.C. 154(b) by 291 days.

(21) Appl. No.: 09/934,081

(22) Filed: Aug. 22, 2001

(65) Prior Publication Data

US 2003/0035116 A1 Feb. 20, 2003

Related U.S. Application Data

(63) Continuation-in-part of application No. 09/883,296, filed on Jun. 19, 2001.

(51) Int. Cl.[7] ........................... G01C 1/00; G01B 11/00; G01B 11/26
(52) U.S. Cl. ..................... 356/399; 356/510; 356/138
(58) Field of Search ..................... 356/509–511

(56) References Cited

U.S. PATENT DOCUMENTS

| | | |
|---|---|---|
| 4,991,961 A | 2/1991 | Strait |
| 5,151,749 A | 9/1992 | Tanimoto et al. |
| 5,363,196 A * | 11/1994 | Cameron .................... 356/500 |
| 5,419,631 A | 5/1995 | Slater |
| 5,638,179 A | 6/1997 | Masuyuki |
| 5,650,848 A | 7/1997 | Larsson |
| 5,739,899 A | 4/1998 | Nishi et al. |
| 5,790,253 A | 8/1998 | Kamiya |
| 5,801,832 A | 9/1998 | Van Den Brink |
| 6,285,457 B2 | 9/2001 | Ukaji |

FOREIGN PATENT DOCUMENTS

JP  9 210648  9/1997

\* cited by examiner

*Primary Examiner*—Zandra V. Smith
(74) *Attorney, Agent, or Firm*—Finnegan, Henderson, Farabow, Garrett & Dunner, LLP

(57) ABSTRACT

An interferometric measurement system capable of measuring tilt of a reflecting surface with respect to a vertical axis. The system preferably includes four laser beams spaced at predetermined distances to measure distances between the measurement system and four locations on the reflecting surface. A controller is also provided for receiving inputs from the measuring laser beams to mathematically determine a tilt of the location being measured.

9 Claims, 5 Drawing Sheets

INTERFEROMETER SYSTEM

REFERENCE TO RELATED APPLICATION

This application is a continuation-in-part of Ser. No. 09/883,296, filed Jun. 19, 2001.

TECHNICAL FIELD

The invention relates generally to an interferometer system for position measurement and more specifically to an interferometer system and method for improving the accuracy of interferometric measurements.

BACKGROUND ART

A laser interferometer is often used to accurately measure relative displacement between two members in a projection exposure system used to manufacture semiconductor devices. The laser interferometer is used as a measuring apparatus for measuring the coordinates of a wafer stage or mask stage for highly accurate positioning of a semiconductor wafer or reticle relative to stationary projection optics.

A prior art laser interferometer system is shown in FIGS. 1 and 2. The interferometer system typically measures a change in position in measurement mirrors 2X and 2Y attached to a movable stage S relative to stationary reference mirrors 1X and 1Y. One or more laser sources (not shown) generate(s) a beam B of light and direct it toward respective beam splitters BX and BY. The beam splitters BX and BY split the beams B into two beams 3 and 4. Beam 3 is the portion of each beam B that is reflected by the beam splitter and directed toward respective reference mirrors 1X and 1Y. The beams 3 reflect off the reference mirrors 1X and 1Y and pass through the beam splitters to give beams C. Beam 4 is the portion of each beam B that passes through the beam splitters and is directed toward respective measurement mirrors 2X and 2Y, and is then reflected by the measurement mirrors back to the respective beam splitters. The reflected beams 4 are reflected by the respective beam splitters where they are combined with reflected beams 3 into the combined beams C.

The combined beams C are then directed into respective sensors SX and SY, where they are analyzed to compare the distances represented by beams 3 and 4. If the measurement mirror 2X moves relative to the reference mirror 1X, the intensity of the combined beam periodically increases and decreases as the reflected light from the two paths alternately interferes constructively and destructively. This constructive and destructive interference is caused by the two beams moving in and out of phase. Each half wavelength of movement of the measurement mirror results in a total optical path change of one wavelength and thus, one complete cycle of intensity change. The number of cycle changes indicates the number of wavelengths that the measurement mirror has moved. Therefore, by counting the number of times the intensity of the light cycles between darkest and lightest, the change in position of the measurement mirror can be estimated as an integral number of wavelengths.

Theoretically, if the measurement mirrors 2X and 2Y are perfectly planar, and the stage to which they are mounted moves perfectly along the x axis, the 2Y mirror surface should not change its position along the y axis during x axis movements of the stage, and the beams 3 and 4 should stay perfectly in phase as received by the sensor SY. In reality, among other disturbances that may cause interference between beams 3 and 4 at the sensor SY in this situation, the mirror 2Y is never perfectly planar (of course the same holds true for mirror 2X). In practice, these mirrors generally have a polishing error of $\lambda/10$ or more which equates, for present semiconductor uses, to up to 60 nm deformations measured from the theoretical plane of the mirror surface.

An example of such a deformation is shown in the 2X mirror in FIG. 2, where the solid line shows the actual deformation of mirror 2X, and the phantom line 2XI shows the ideal perfectly flat surface, with the deformation indicated by d. The shift of the reflection point from the ideal plane, caused by the bowing of the mirror by distance d, brings about a measurement error, since the interferometer is no longer measuring from the actual reflection point on the ideal planar surface. This error or deformation can be corrected by a pre-measurement of the reflection surface of the measurement mirror 2X. A shift of the reflection point caused by deformation of the mirror in the x-z plane is typically averaged because the stage stroke along the z axis is small enough, compared with the beam size, to be less significant than the errors induced by bowing.

U.S. Pat. No. 5,790,253 to Kamiya describes an interferometer system for correcting linearity errors of a moving mirror and stage. Thus, Kamiya can correct for the deformation in the mirror along the long axis of the mirror, which is referred to in the art as correcting "mirror bow". To correct for mirror bow, Kamiya measures the curvature data of the moving mirror prior to its installation on the stage and stores the data as mapping data. Kamiya takes discrete curving error measurement along the length of the mirror after it has been mounted on the stage. Finally, a main controller creates continuous curvature error data after installation of the mirror on the wafer based on the relationship between the data generated before and after mounting the mirror on the stage. The continuous curvature error data is then used as correction data for more accurately placing the stage.

U.S. Pat. No. 5,363,196 to Cameron also describes an interferometer system for correcting mirror bow of a moving mirror mounted to a stage. Cameron provides two interferometer laser metering devices, either one of which is capable of providing measurement data of the angle of rotation of the stage in the x-y plane, for use by computer controlled servo devices that control the x-y movement of the stage. In a calibration mode, the servo devices may receive data of specific measurements defining the respective values of undesired departures from flatness or straightness of the moving mirror surfaces that are mounted to the stage. The departure data is stored in memory, and may be used by the computer controlled servo devices to compensate for the undesired departures in linearity of the mirrors, during the actual movement and processing phases of the stage. Cameron also discloses that, if desired, an additional interferometer may be provided along each of the x and y axes to measure twist in the moving mirrors. However, because of the long, narrow aspect ration of both of the moving mirrors, Cameron indicates that determination of twist may not be worth pursuing.

Sueyoshi, in Japanese HE19-210648, discloses a method and device for measuring a plane shape at a desired pitch by detecting positional information on the plane along three specified points that are separated by predetermined distances. For example, three x direction interferometers are aligned in the y direction and spaced at predetermined distances along the y direction. A similar arrangement is provide for y direction interferometers. These arrangements are then used to take measurements for a determination of mirror bowing in the x and y reflective mirrors, respectively.

As manufacturers of integrated circuits attempt to increase circuit density and reduce circuit feature size, interferometers are required to provide more precise measurement data. As the circuit density increases, the tolerance for error in alignment of the stage system decreases, so that a shift of the reflection point caused by deformation of a mirror in the x-z or y-z plane also becomes more significant. Additionally, if the stage tilts, a lateral shift of the reflection point occurs which will not be detected by a system for correction of mirror bowing. The result is an error in the position measurement of the stage that results in misalignment of circuit patterns on the wafer (mounted on the stage) relative to one another.

There is, therefore, a need for an interferometer system that measures and corrects for deformation of moving mirrors as well as tilt of the mirrors and tilt of the stage with respect to the z axis.

SUMMARY OF THE INVENTION

The invention provides a measuring system that measures and corrects for deformation and tilt of substantially planar surfaces with respect to a vertical axis. The measurement system generally includes first, second, third and fourth sensors, each capable of generating data indicative of a distance between the sensors, respectively, and corresponding locations on a reflective surface of the reflective object. A controller is provided for receiving inputs from the first, second, third and fourth sensors and determining a tilt of the reflective surface with respect to a z axis. A support on which the reflective object is mounted has a generally planar surface that is generally perpendicular to the z axis but which may tilt with respect thereto. The reflective object is mounted to the support so that said reflective surface is in a plane substantially parallel with the z axis and longitudinally extends substantially parallel to an axis normal to the z axis.

The first and second sensors are aligned substantially parallel to the axis normal to the z axis along which the reflective surface extends longitudinally and are separated by a distance a. The third and fourth sensors are aligned substantially parallel to the axis normal to the z axis along which the reflective surface extends longitudinally and are separated by the distance a. The first and third sensors are aligned substantially parallel to the z axis and are separated by the distance a, and the second and fourth sensors are aligned substantially parallel to the z axis and are separated by the distance a.

The controller determines a tilt of the reflective surface at a location ka along the longitudinally extending direction of the reflective surface according to the following formula:

$$\Delta(ka)=\Phi((k+1)a)-\Phi(ka)$$

where:

$\Delta(ka)$ is a measure of a displacement of the reflective surface out of the plane substantially parallel with the z axis, at location ka;

$\Phi(ka)$ is a measure of tilt of the reflective surface measured by the second and fourth sensors; and $\Phi((k+1)a)$ is a measure of tilt of the reflective surface measured by the first and third sensors.

In a preferred embodiment, the first, second, third and fourth sensors comprise first, second, third and fourth measuring laser beams L1, L2, L3 and L4 that are emitted from an interferometric measurement system. The beams L1 AND L2 are aligned along an imaginary line parallel to the y axis, and the beams L3 and L4 are aligned along another imaginary line parallel to the y axis and separated from the imaginary line joining L1 and L2 by a distance a. Further, the beams L2 and L4 are aligned along an imaginary line parallel to the z axis, and the beams L1 and L3 are aligned along another imaginary line parallel to the z axis and separated from the imaginary line joining L2 and L4 by the distance a. Thus, the distances between L1 AND L2, L1 and L3, L2 and L4, and L3 and L4 are all equal to a. A reflective surface or mirror can be located at position ka along the y axis with respect to the system, and can alternately be located at position ka+a along the y axis with respect to the system.

The measurement values obtained by the system through the beams L1, L2, L3 and L4 when the mirror is at position y=ka are determined according to the following equations:

$$L2(ka)=s(ka)+\delta(ka)-(a/2)\theta(ka) \qquad (4)$$

$$L4(ka)=t(ka)+\delta(ka)+(a/2)\theta(ka) \qquad (5)$$

$$L1(ka)=s(ka+a)+\delta(ka)-(a/2)\theta(ka) \qquad (6)$$

$$L3(ka)=t(ka+a)+\delta(ka)+(a/2)\theta(ka) \qquad (7)$$

where:

$\theta(x)$ is a measure of the tilt of the support or stage on which the mirror is mounted;

$s(x)$ is the x coordinate of the shape of the mirror surface at z=0;

$t(x)$ is the x coordinate of the shape of the mirror surface at z=−a;

$\delta(x)$ is a measurement of the displacement of the stage along the x axis direction that can be due to factors such as vibration, control error and the like; and a is a distance between measurement beams as defined above.

In order to simplify terms, J1 is defined as the difference between equations (5) and (4), and J2 is defined as the difference between equations (7) and (6) as follows:

$$J1(ka)\equiv(L4(ka)-L2(ka))/a=(t(ka)-s(ka))/a+\theta(ka)=\Phi(ka)+\theta(ka) \quad (8)$$

where $(t(x)-s(x))/a$ is defined as the mirror tilt $\Phi(x)$; and $$J2(ka)\equiv(L3(ka)-L1(ka))/a=(t((k+1)a)-s((k+1)a))/a+\theta(ka)=\Phi((k+1)a)+\theta(ka) \quad (9)$$

Next, the difference between terms J2 and J1 is calculated by subtracting equation (8) from equation (9) to give the mirror tilt at position y=ka:

$$\Delta(ka)=J2(ka)-J1(ka)=\Phi((k+1)a)-\Phi(ka) \qquad (10)$$

After determination of initial tilt values near an end of the mirror, the mirror is incrementally moved with respect to the sensors, preferably by at least one motor, to continue measuring displacement of the mirror out of the intended plane with respect to the z axis. The measurements are performed at each incremental location. In the preferred embodiment, the mirror is thus moved incrementally in the y axis direction and measurement values are obtained by the system through the beams L1, L2, L3 and L4 at position y=ka+a according to the equations (4)–(7) above, where y now equals ka+a. This process is repeatedly performed while incrementally moving the mirror in the y axis direction by a distance a for each iteration. By storing these values in a controller, the mirror tilt can readily be determined at any of the incremental positions along the mirror by a simple summation of the differential tilt values obtained from an initial end of the mirror, where the first tilt measurement was made, sequentially up to the actual location on the mirror where it is desired to determine the mirror tilt.

In general, the measurement values determined by the interferometer system at y=(k−1)a, (k−2)a, . . . a, 0 can be described as:

$$\Delta((k-1)a)=\Phi(ka)-\Phi((k-1)a)$$
$$\Delta((k-2)a)=\Phi((k-1)a)-\Phi((k-2)a)$$
$$\ldots$$
$$\Delta(0)=\Phi(a)-\Phi(0)$$

Since the tilt measurement values are differential values defined with respect to the previously measured value, a tilt value for a given location can be determined by summing the sequence of values preceding and including that location. A summation of the general equations given above gives:

$$\sum_{m=0}^{k-1} \Delta(ma) = \Phi(ka) - \Phi(0) \qquad (11)$$

Therefore, a mirror tilt value at position ka is given by the equation:

$$\Phi(ka) = \Phi(0) + \sum_{m=0}^{k-1} \Delta(ma) \qquad (12)$$

Thus, the mirror tilt of the mirror at position ka can be readily determined using equation (12). This value is then added, by the controller, to the interferometer position measurement value that is inputted to the controller, to more accurately position the stage by including the lateral offset due to the mirror tilt.

Additionally, the measurement system preferably includes a second reflective surface and a second set of four sensors, preferably four measuring laser beams incorporated into an interferometric measurement system that measures the second substantially planar reflective surface that is oriented orthogonally to the first reflective surface. Measurements from the second set of sensors are also inputted to the controller for a determination of tilt of the second reflective surface. The determination is made according to the same procedure used to determine tilt of the first reflective surface.

The invention also provides a method of measuring the tilt of a substantially planar surface that includes (1) providing a measurement system having the capability of measuring distances between first, second, third and fourth adjacent locations on the substantially planar surface and respective first, second, third and fourth adjacent locations on the measurement system, where the distances measured are along imaginary lines substantially perpendicular to the substantially planar surface; (2) positioning the substantially planar surfaces such that the measurement system is near an end of the substantially planar surface; (3) measuring distances between the pairs of first, second, third and fourth locations; (4) subtracting the distance between the second locations from the distance between the fourth locations and dividing the difference by a distance between the second and fourth locations on the substantially planar surface to give a term J1; (5) subtracting the distance between the first locations from the distance between the third locations and dividing the difference by the distance between the first and third locations on the substantially planar surface to give a term J2; and (6) determining a tilt of the substantially planar surface at the location of the substantially planar surface according to the following formula:

$$\Delta(ka)=J2(ka)-J1(ka)=\Phi((k+1)a)-\Phi(ka)$$

where:
- $\Delta(ka)$ is a measure of a displacement out of the substantially planar surface;
- $\Phi(ka)$ is a measure of tilt of the substantially planar surface with respect to the vertical axis measured between the second and fourth locations;
- $\Phi((k+1)a)$ is a measure of tilt of the substantially planar surface with respect to the vertical axis measured between the first and third locations; and
- a is a distance between the first and second locations on the substantially planar surface.

The method preferably further includes (1) incrementally moving the substantially planar surface in a direction parallel to an axis normal to the vertical axis and away from the end of the surface by the distance a; (2) measuring distances between the first, second, third and fourth locations on the measurement system and the respective four new locations on the substantially planar surface; (3) subtracting the distance between the second locations from the distance between the fourth locations and dividing the difference by a distance between the second and fourth locations on the substantially planar surface to give a term J1; (4) subtracting the distance between the first locations from the distance between the third locations and dividing the difference by the distance between the first and third locations on the substantially planar surface to give a term J2; and (5) determining a tilt of the substantially planar surface at the new location incrementally removed from a previously measured location according to the following formula:

$$\Delta(ka+a)=J2(ka+a)-J1(ka+a)=\Phi((k+2)a)-\Phi((k+1)a)$$

where:
- $\Delta(ka+a)$ is a measure of a displacement out of the substantially planar surface;
- $\Phi((k+1)a)$ is a measure of tilt of the substantially planar surface with respect to the vertical axis measured between the second and fourth locations on the measurement system and the new locations on the substantially planar surface; and
- $\Phi((k+2)a)$ is a measure of tilt of the substantially planar surface with respect to the vertical axis measured between the first and third locations on the measurement system and the new locations on the substantially planar surface.

Incremental measurements are continued by incrementally repeating the previously described incremental procedure, until an opposite end of the substantially planar surface is reached and no further incremental measurements can be taken, or until a predetermined length of the substantially planar surface has been measured.

As described above, a determination of the tilt of the substantially planar surface with respect to the vertical axis for any predetermined position ka can be determined according to the following formula:

$$\Phi(ka) = \Phi(0) + \sum_{m=0}^{k-1} \Delta(ma)$$

where:
- $\Phi(ka)$ is a measure of tilt of the substantially planar surface with respect to the vertical axis at position ka;
- $\Phi(0)$ is a measure of tilt of the substantially planar surface near the end of the substantially planar surface where an initial measurement was taken; and Δ(ma) is a measure of displacement out of the substantially planar surface, at locations where m=0, 1, 2, ... k−1.

The above is a brief description of some deficiencies in the prior art and advantages of the invention. Other features, advantages, and embodiments of the invention will be apparent to those skilled in the art from the following description, drawings and claims.

BRIEF DESCRIPTION OF THE DRAWINGS

Corresponding reference characters indicate corresponding parts throughout the several views of the drawings.

DESCRIPTION OF THE INVENTION

Figure 1:
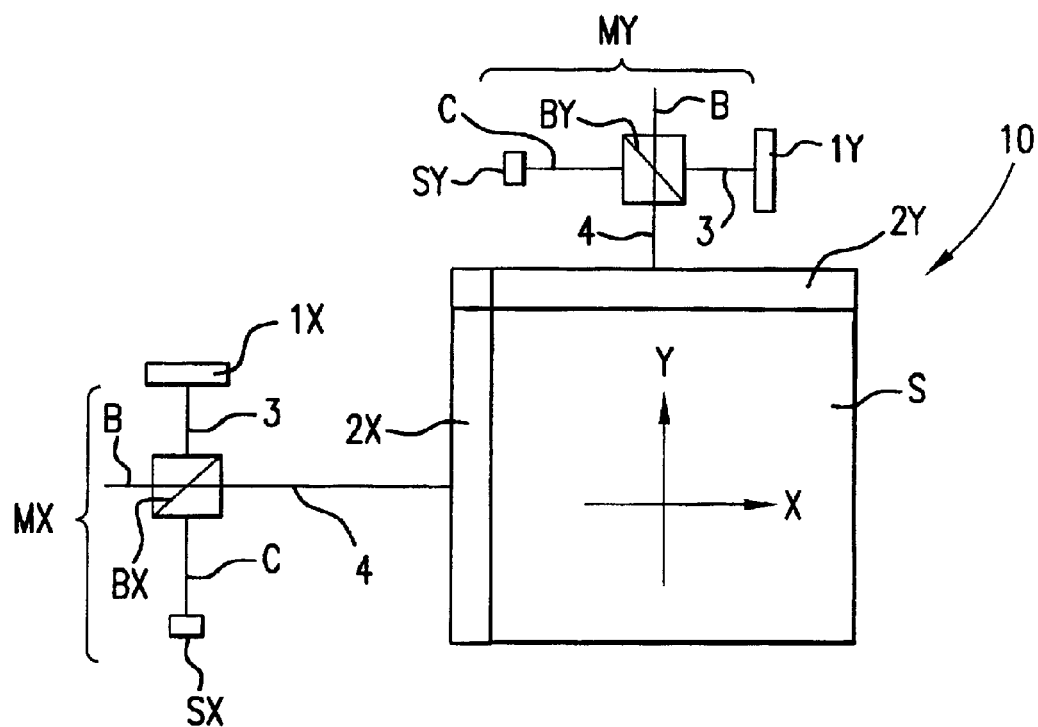
FIG. 1 is a plan view of a prior art interferometer system for measuring position of a stage movable in x and y directions.
Figure 2:
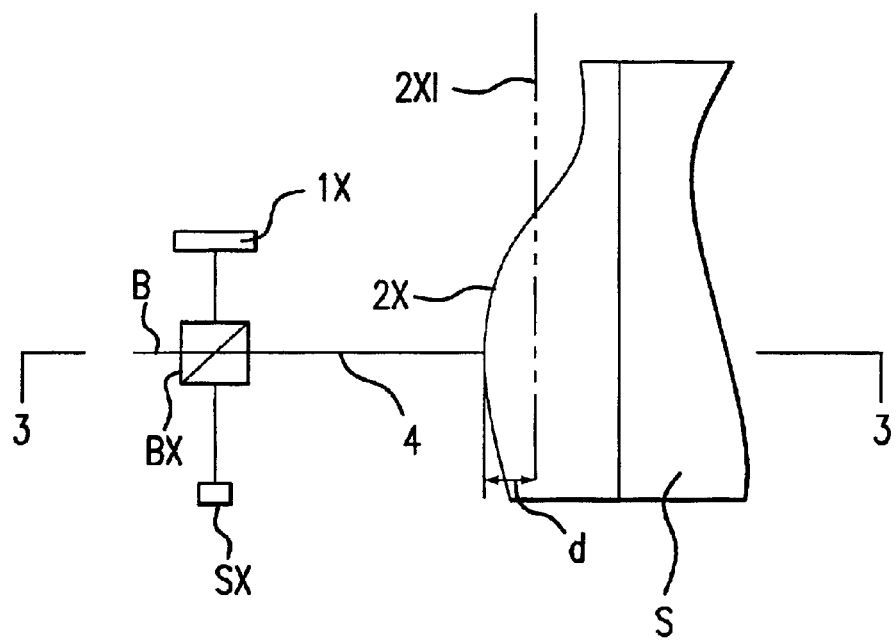
FIG. 2 is a partial view of the prior art interferometer system of FIG. 1 showing an exaggerated view of mirror bowing, or deformation in the x-y plane.

An interferometer, such as one used in the prior art system 10 shown in FIGS. 1–2, is used to accurately measure the displacement of a measurement target (e.g., stage S) by using interference between light waves that have propagated along a measurement optical path 4 and a reference optical path 3. The interferometer may be used as a position measurement system of a stage apparatus such as a wafer stage or a mask stage in a one-shot or scan type exposure apparatus for which highly precise driving control is required. The interferometer is not limited to use with an exposure apparatus. The interferometer may be used to accurately measure the relative displacement between two members in various high precision tools, for example.

A measurement mirror (reflector) 2X is attached to the stage S and movable therewith to provide measurement of the measurement optical path 4, and a reference mirror (reflector) 1X is attached to a lens or other stationary portion of the exposure apparatus to provide the reference optical path 3. The measurement mirror 2X is attached to the stage S parallel to the y direction and measurement mirror 2Y is attached to the stage S parallel to the x direction (FIG. 1). The measurement mirror 2X is used to measure displacement of the stage along the x axis while the measurement mirror 2Y is used to measure displacement of the stage along the y axis.

As shown in exaggerated form in FIG. 2, a measurement mirror, in this case measurement mirror 2X, is never perfectly planar but will have a certain amount of "bow" or deformation with respect to the axis that it is set up to parallel, in this case, the y axis. The deformation out of the ideal plane 2XI that is parallel to the y axis, results in a change in the length of the measuring beam 4 as the stage S is moved in the y direction and the area of the mirror having the deformation d passes the path of the beam 4. Unless this deviation is compensated for, the deformation d will cause an error of the stage position. These inaccuracies in the stage position cause misalignment of the circuits on the semiconductor wafer that is mounted on the stage S.

Figure 3:
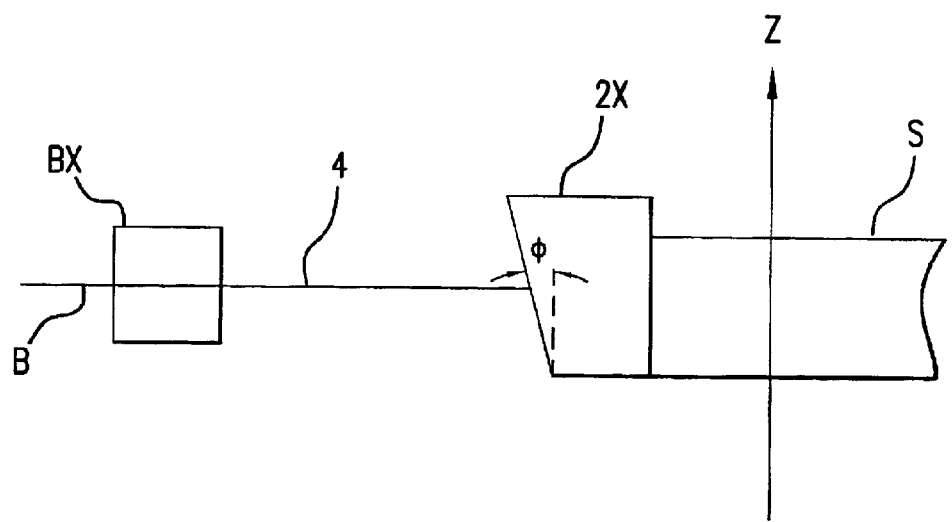
FIG. 3 is a side view of an interferometer system where a moving mirror is perfectly parallel to the z axis.
Figure 4:
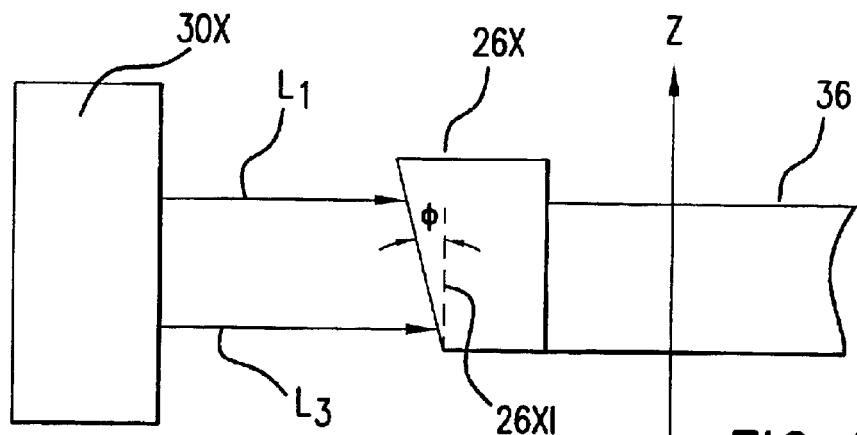
FIG. 4 is a side view of an interferometer system where a moving mirror tilts at an angle Φ with respect to the z axis.

The interferometer system shown in FIGS. 1 and 2 cannot detect deviations of the measurement mirror 2X where the surface of the measurement mirror 2X deviates from the ideal surface that is parallel to the z axis. It is known that a measurement mirror, in this case measurement mirror 2X, is never perfectly parallel to the z axis, but will have a certain amount of "tilt" with respect to the z axis. FIG. 3 shows the case where the moving mirror is perfectly parallel to the z axis. FIG. 4 shows the case where the moving mirror tilts at an angle Φ with respect to the z axis. When the moving mirror tilts at an angle of Φ with respect to the z axis, and the interferometer has an offset distance of h, the interferometer measurement error is Δx, where Δx=hΦ. For example, when h=1 mm and Φ=5 μrad, Δx=5 nm. The tilt angle Φ is a function of the stage position x or y as well as the mirror bow d. If Φ can be measured and mapped as a function of x or y, the measurement error Δx can be corrected using the equation Δx=hΦ.

The interferometer systems of the invention measure displacement due to mirror tilt and stage tilt, as well as displacement due to mirror bowing. In order to measure tilt, measurement beams must be displaced with regard to one another along the z axis, as shown in FIG. 4 by the placement of measurement beams L1 and L3. FIG. 4 is a partial schematic view of an interferometer system 20 according to the invention. As can be seen in FIG. 4, beams L1 and L3 are displaced with regard to one another along the z axis, while being aligned with regard to the y axis. Thus, any differences in the measurement lengths of beams L1 and L3 will indicate tilt with respect to the z axis and will not reflect bowing deviations. As is evident in FIG. 4, the tilt of the surface of measurement mirror 26x with regard to the ideal 26XI by the angle Φ results in a difference between the lengths of measurement beams L1 and L3 that when analyzed can give the degree of tilt between the two measuring points contacted by measurement beams L1 and L3, respectively.

When the stage 36 is not tilted with respect to the z axis (FIG. 4), the coordinates of a point on the reflecting surface of mirror 26X upon which a measurement beam is incident are given by the equation (1):

$$z = -(1/\tan \Phi)(x+L) \quad (1)$$

where:
- z = the z coordinate of the location on the measurement mirror 26X on which the measurement beam is incident;
- Φ the mirror tilt with respect to the z axis, as described above;
- x = the x coordinate of the location on the measurement mirror 26X on which the measurement beam is incident; and
- L = the distance between the center of tilt (i.e., the central axis of the illumination lens, or the optical axis of the projection lens) and the location on the measurement mirror 26X on which the measurement beam is incident, measured parallel to the x axis.

Figure 5:
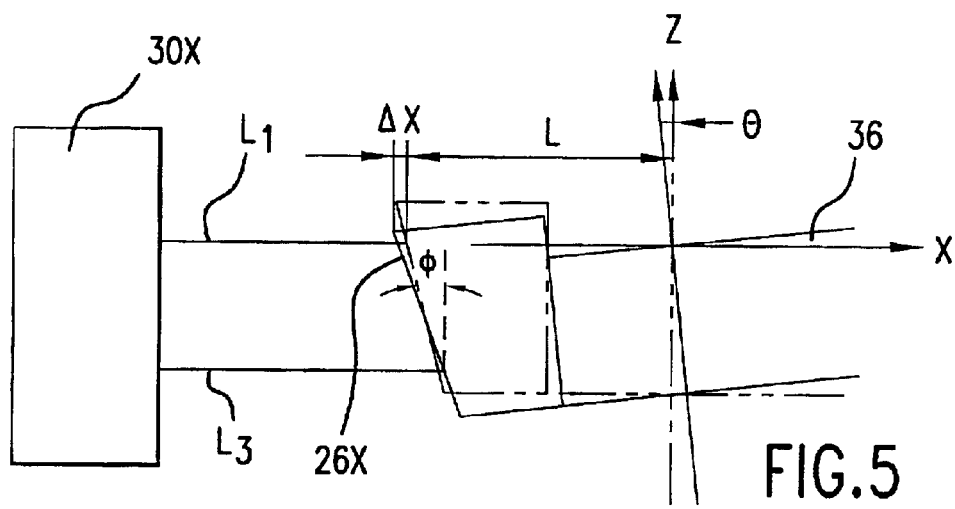
FIG. 5 is a schematic showing changes in optical path lengths of light beams due to combined effect of mirror tilt and stage tilt.

In situations where the stage 36 is tilted with respect to the z axis (FIG. 5), the mirror surface becomes laterally shifted in the x axis direction by an amount in addition to the mirror tilt, due to the tilting angle θ of the stage 36 about the z axis. The additional lateral displacement is indicated by Δx in FIG. 5 and is measured by the displacement between the x coordinate of the mirror surface when stage tilt is zero (as indicated by a phantom line in FIG. 5) and the x coordinate of the mirror surface as effected by both the mirror tilt and the stage tilt (as shown by the solid line). The coordinates of a point on the reflecting surface of mirror 26X upon which a measurement beam is incident, in a situation as shown in FIG. 5, are given by the equation (2):

$$x(\tan \Phi \sin \theta - \cos \theta) - z(\tan \Phi \cos \theta + \sin \theta) + L = 0 \quad (2)$$

where θ=the tilting angle θ of the stage 36 about the z axis, as described above.

By setting the axis of L1 of the interferometer to have the coordinate z=0, the deviation Δx of the mirror surface where it intersects with L1 can be derived. By setting z=0 in equations (1) and (2) above and taking the difference in the x values arrived at, an equation for Δx is defined as follows:

$$\Delta x = L\theta^2/2 + L\Phi\theta \quad (3)$$

Thus, the second term in the equation (3) takes into account the mirror tilt Φ and the first term is only affected by stage tilt θ. As an example, if the mirror tilt Φ is about 3 μrad, stage tilt θ is about 1 mrad and L is about 500 mm, then the component effected by mirror tilt Φ (i.e., LΦθ) alters the term Δx by about 1.5 nm. Accordingly, if the mirror tilt Φ is not measured and corrected, in this example the interferometer measurement will have a 1.5 nm measurement error. Although in the past this error has been ignored because it is much smaller than the error values due to mirror bowing, the density of integrated circuit patterns have become such that the tilt error can no longer be ignored.

Figure 7:
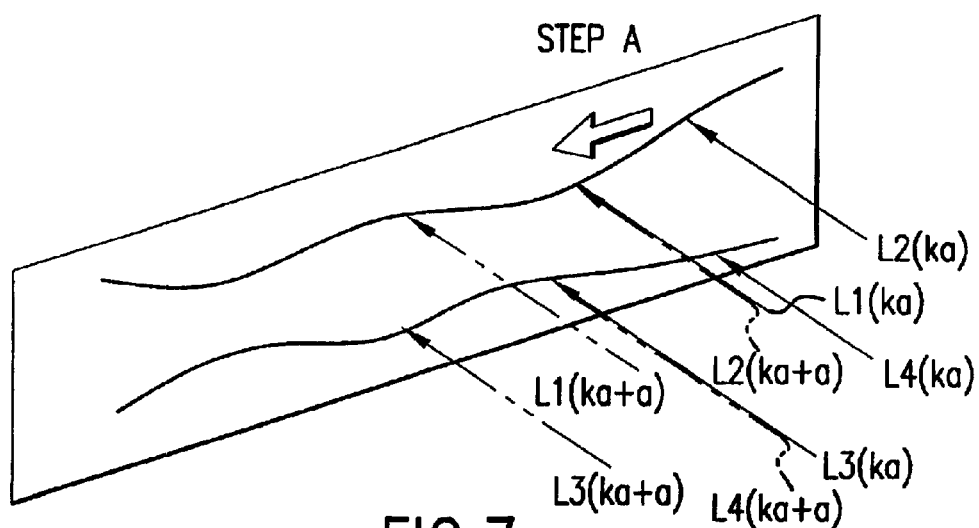
FIG. 7 is a schematic showing the pattern of measurement beams resultant from a preferred layout of interferometers used to measure mirror deformation in the x-z plane.
Figure 6:
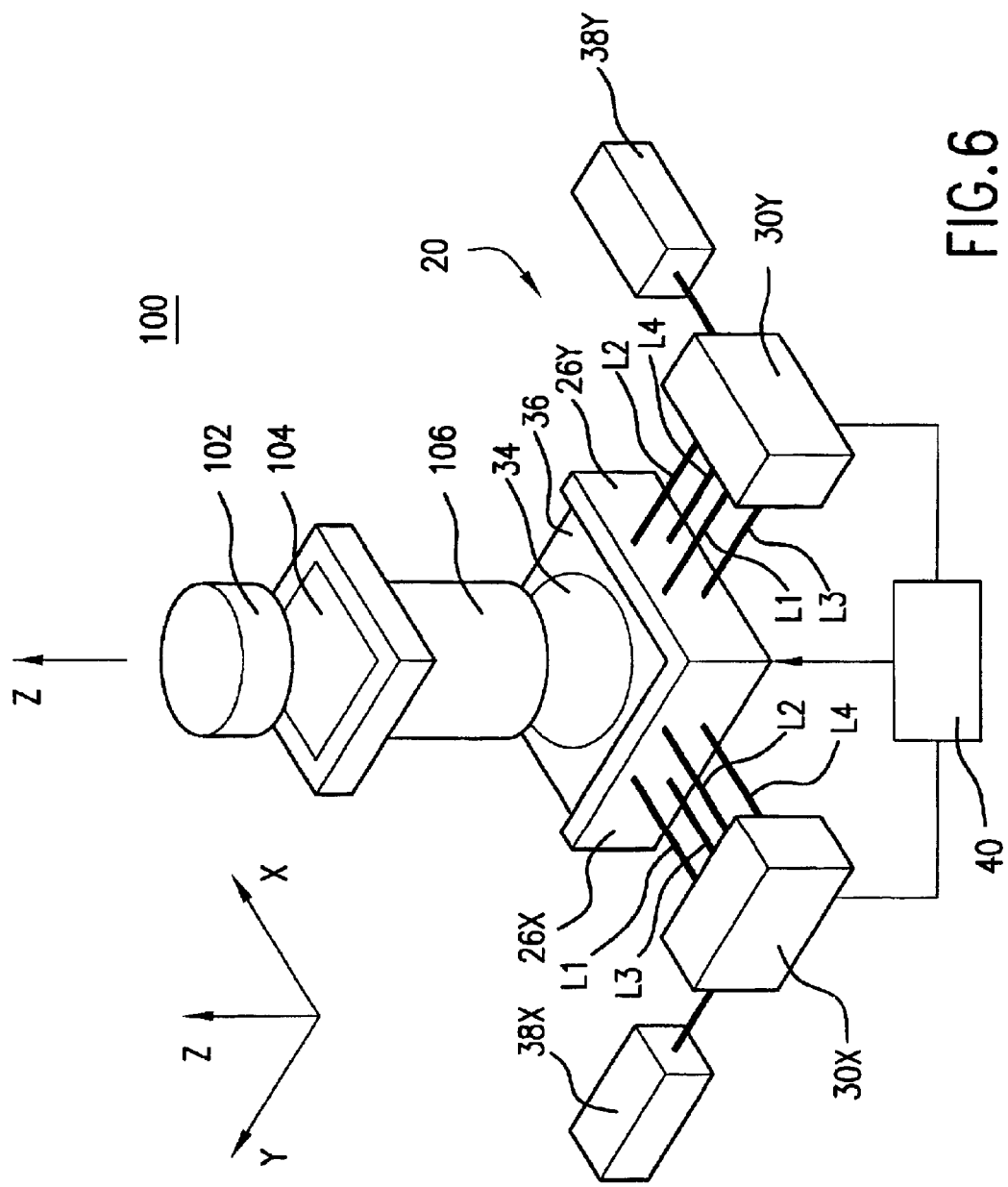
FIG. 6 is a perspective view of an interferometer system of the invention applied to a wafer stage of a projection type exposure apparatus.

FIG. 6 shows a preferred arrangement of an interferometer system 20 according to the invention applied to a wafer stage 36 of a projection type exposure apparatus 100. The apparatus is described in further detail below. FIG. 7 shows the relative positioning of measurement beams L1, L2, L3 and L4 emitted from interferometer system 30X that has the ability to measure mirror tilt of the measurement mirror 26X with respect to the z axis.

FIG. 7 shows the relational positions of beams L1, L2, L3 and L4 in solid lines when the mirror 26X is located at position ka along the y axis with respect to the interferometer system 30X, and the relational positions of beams L1, L2, L3 and L4 in phantom lines when the mirror 26X is located at position ka+a along the y axis with respect to the interferometer system. The beams L1 and L2 are aligned along an imaginary line parallel to the y axis, and the beams L3 and L4 are aligned along another imaginary line parallel to the y axis and separated from the imaginary line joining L1 and L2 by a distance a. Further, the beams L2 and L4 are aligned along an imaginary line parallel to the z axis, and the beams L1 and L3 are aligned along another imaginary line parallel to the z axis and separated from the imaginary line joining L2 and L4 by a distance a. Thus, the distances between L1 AND L2, L1 and L3, L2 and L4, and L3 and L4 are all equal to a.

The measurement values obtained by the interferometer system through the beams L1, L2, L3 and L4 at position y=ka are determined according to the following equations:

$$L2(ka) = s(ka) + \delta(ka) - (a/2)\theta(ka) \quad (4)$$

$$L4(ka) = t(ka) + \delta(ka) + (a/2)\theta(ka) \quad (5)$$

$$L1(ka) = s(ka+a) + \delta(ka) - (a/2)\theta(ka) \quad (6)$$

$$L3(ka) = t(ka+a) + \delta(ka) + (a/2)\theta(ka) \quad (7)$$

where:
θ(x) is a measure of the stage 36 pitching as described above;
s(x) is the x coordinate of the shape of the mirror 26X surface at z=0;
t(x) is the x coordinate of the shape of the mirror 26X surface at z=−a;
δ(x) is a measurement of the displacement of the stage 36 along the x axis direction that can be due to factors such as vibration, control error and the like; and
a is a distance between measurement beams as defined above.

In order to simplify terms, J1 is defined as the difference between equations (5) and (4), and J2 is defined as the difference between equations (7) and (6) as follows:

$$J1(ka) \equiv (L4(ka) - L2(ka))/a = (t(ka) - s(ka))/a + \theta(ka) = \Phi(ka) + \theta(ka) \quad (8)$$

where (t(x)−s(x))/a is defined as the mirror tilt Φ(x); and $$J2(ka) \equiv (L3(ka) - L1(ka))/a = (t((k+1)a) - s((k+1)a))/a + \theta(ka) = \Phi((k+1)a) + \theta(ka) \quad (9)$$

Next, the difference between terms J2 and J1 is calculated by subtracting equation (8) from equation (9) to give the mirror tilt at position y=ka:

$$\Delta(ka) = J2(ka) - J1(ka) = \Phi((k+1)a) - \Phi(ka) \quad (10)$$

Figure 8:
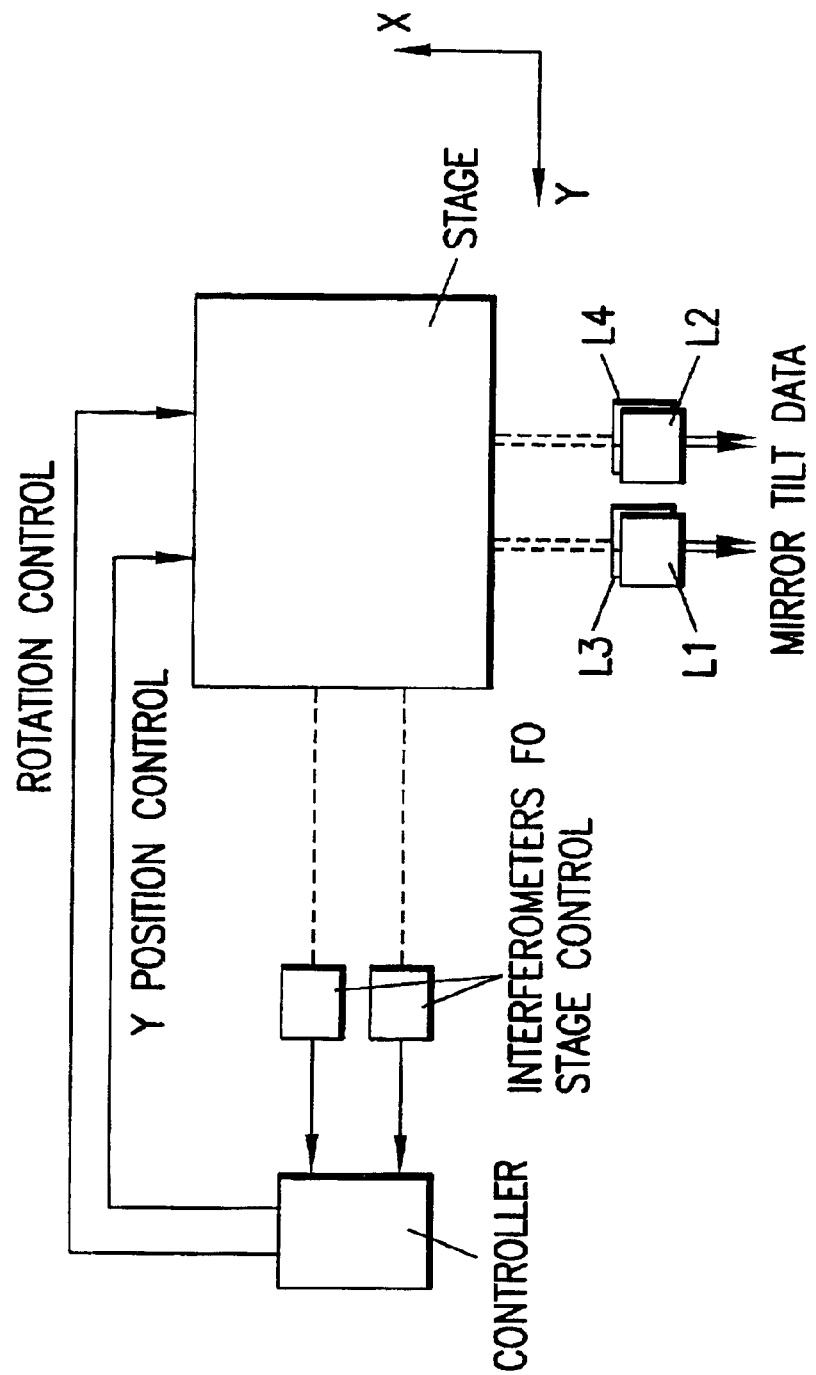
FIG. 8 is a schematic showing a structure that enables a stage of an interferometer system to be incrementally moved.

The mirror 26X is next moved incrementally in the y axis direction. FIG. 8 illustrates the structure that enables the stage S (and therefore the mirror 26X) to be moved. Accordingly, measurement values are obtained by the interferometer system through the beams L1, L2, L3 and L4 at position y=ka+a (as shown by the phantom lines in FIG. 7) according to the equations (4)–(7) above, where y now equals ka+a:

$$L2(ka+a) = s(ka+a) + \delta(ka+a) - (a/2)\theta(ka+a) \quad (4')$$

$$L4(ka+a) = t(ka+a) + \delta(ka+a) + (a/2)\theta(ka+a) \quad (5')$$

$$L1(ka+a) = s(ka+a+a) + \delta(ka+a) - (a/2)\theta(ka+a) \quad (6')$$

$$L3(ka+a) = t(ka+a+a) + \delta(ka+a) + (a/2)\theta(ka+a) \quad (7')$$

Again, in order to simplify terms, J1 and J2 are defined according to the equations (8) and (9) above:

$$J1((k+1)a) \equiv (L4((k+1)a) - L2((k+1)a))/a = (t((k+1)a) - s((k+1)a))/a + \theta((k+1)a) = \Phi((k+1)a) + \theta((k+1)a) \quad (8')$$

$$J2((k+1)a) \equiv (L3((k+1)a) - L1((k+1)a))/a = (t((k+2)a) - s((k+2)a))/a + \theta((k+1)a) = \Phi((k+2)a) + \theta((k+1)a) \quad (9')$$

Again, the difference between terms J2 and J1 is calculated by subtracting equation (8') from equation (9') to give the mirror tilt at position x=ka+a:

$$\Delta((k+1)a) = J2((k+1)a) - J1((k+1)a) = \Phi((k+2)a) - \Phi((k+1)a) \quad (10')$$

This process is repeatedly performed while incrementally moving the mirror 26X in the y axis direction by a distance a for each iteration. By storing these values in the controller 40, the mirror tilt can readily be determined at any of the incremental positions along the mirror 26X by a simple summation of the differential tilt values obtained from an initial end of the mirror 26X, where the first tilt measurement was made, sequentially up to the actual location on the mirror 26X where it is desired to determine the mirror tilt.

In general, the measurement values determined by the interferometer system 30X at y=(k−1)a, (k−2)a, ... a, 0 can be described as:

$$\Delta((k-1)a) = \Phi(ka) - \Phi((k-1)a)$$

$$\Delta((k-2)a) = \Phi((k-1)a) - \Phi((k-2)a)$$

...

$$\Delta(0) = \Phi(a) - (\Phi(0)$$

Since the tilt measurement values are differential values defined with respect to the previously measured value, a tilt value for a given location can be determined by summing the sequence of values preceding and including that location. A summation of the general equations given above gives:

$$\sum_{m=0}^{k-1} \Delta(ma) = \Phi(ka) - \Phi(0) \quad (11)$$

Therefore, a mirror tilt value at position ka is given by the equation:

$$\Phi(ka) = \Phi(0) + \sum_{m=0}^{k-1} \Delta(ma) \quad (12)$$

Thus, the mirror tilt of the mirror 26X can be readily determined using equation (12). If we assume that the initial measurement location along mirror 26X is a location very near the intersection of the mirrors 26X and 26Y shown in FIG. 6, then the incremental measurements will be made moving toward the opposite end of the mirror 26X along the y axis, as schematically illustrated by FIG. 7 which shows a one step increment. It is not possible to directly measure the tilt at the very ends of the mirror, due to the lateral displacement of the beams L1 and L3 from L2 and L4, and because all of the beams L1–L4 are used to measure a tilt value, as described above. If a mirror area L is used for exposure, a mirror length of L+2a can be used to measure mirror tilt.

Further assuming that mirror 26X is located in position ka in FIG. 6, the tilt of the mirror 26X at position ka can be determined by summing all of the incremental differential values of Δ and adding them to the initial measurement, as described above in equation (12). This value is then added, by the controller 40, to the interferometer position measurement value that is inputted to the controller 40, to more accurately position the stage 36 by including the lateral offset due to the mirror tilt. It is noted that although only incremental values for the mirror tilt are measured and stored, it is possible to interpolate, using algorithms known in the art (such as a Spline interpolation algorithm), between values to determine a value of a final increment for a position of the stage that is not located directly at one of the incremental measurement positions. If a mirror area L is used for exposure, a mirror length of L+2a can be used to measure mirror tilt.

In a similar manner to that described above, determination of the tilt measurements of the mirror 26Y can be determined, and inputted to the controller 40. The tilt measurement value is added by the controller 40 to the interferometer position measurement value of the y position of the stage, which is inputted to the controller 40 from interferometer system 30Y, to more accurately position the stage 36 by including the lateral offset in the y direction due to the mirror tilt (i.e., the component of Δy effected by mirror tilt in the y-z plane).

It is further noted that interferometer systems 30X and 30Y have the capability of correcting for mirror bowing, and providing control measurements to control yawing, according to techniques known in the art. Beams L1, L2, L3 and L4 in each of interferometer systems 30X and 30Y may be formed using a single laser with appropriate optical components to form the four beams, as would be readily apparent to one of ordinary skill in the art, or may comprise four aligned sources to form the four beams, or two beams with appropriate optical components, or other combinations that would be apparent to those of ordinary skill in the art. Preferably a single laser source is used in each of interferometer systems 30X and 30Y. Further, although laser metering is preferred to precisely measure the distances according to the invention, the invention is not to be limited only to the use of laser metering, but may be applied to other distance measuring technologies or sensors that are capable of providing an adequate degree of measurement precision for the use to which the invention is being applied.

Referring again to FIG. 6, a schematic illustration of an example of an interferometric measuring system 20 according to the invention is shown applied to an exposure apparatus, the entire apparatus being generally referred to by reference numeral 100. The exposure apparatus 100 generally comprises an illumination system 102, the wafer stage 36 for supporting and positioning the wafer 34, a reticle stage (not shown) for supporting and positioning a reticle 104, and motors (not shown) for positioning the wafer stage 36 and the reticle stage. The illumination system 102 projects energy in the form of, for example, light or an electron beam light through a mask pattern (e.g., circuit pattern for a semiconductor device) formed in the reticle 104 that is supported and scanned using the reticle stage. In an optical system, the illumination system 102 is part of an optical system that further includes a projection lens 106. The illumination system 102 preferably has an optical integrator (not shown) for producing secondary light source images and a condenser lens for illuminating the reticle 104 with uniform light flux. The projection lens 106 focuses the light or electron beam received through the reticle 104, onto the wafer 34. The wafer 34 is positioned under the projection lens 106 and preferably held, for example, by vacuum suction or electrostatic suction on a wafer holder (not shown) that is supported by the wafer stage 36. In operation, light or electron beams from the illumination system 102 pass through the reticle 104 and expose resist on the wafer 34, which is supported and scanned using the wafer stage 36 driven by the motor.

The stage 36 is movable in at least two directions along the x and y axes in a plane perpendicular to an optical axis of the exposure apparatus 200, which is defined as the z axis. Measurement mirrors 26X and 26Y are provided at two locations around the stage 36. The measurement mirror 26Y has its reflecting surface extending along or parallel to the x axis for measuring movement of the stage 36 in the y direction and the measurement mirror 26X has its reflecting surface extending along or parallel to the y axis for measuring movement of the stage in the x direction. The interferometer systems 30X and 30Y are mounted with respect to the mirrors 26X and 26Y, respectively, so as to illuminate the respective mirrors with a pattern of measuring beams L1, L2, L3 and L4, as described above. In the system shown in FIG. 6, each of the interferometer systems 30X and 30Y is provided with a laser head 38X, 38Y that provides the laser illumination for the formation of the measurement beams L1, L2, L3 and L4. The interferometer systems 30X and 30Y input measurement values to the controller 40, which analyzes the inputted measurement data and determines an accurate position of the stage 36, as described above. In addition to measurement of distance values in the X and Y directions, the interferometer systems 30X and 30Y, together with the controller 40, can provide accurate yaw, pitch and roll control, as described above, where pitch is defined here as tilt in the x-z plane and roll is defined as tilt in the y-z plane. To provide more accurate measurement and positioning, the interferometer systems incrementally measure the tilt of the mirrors 26X and 26Y, as described above, and these values are stored in the controller to be relied upon, during real time measurement, to more accurately measure lateral offset $\Delta x$ and $\Delta y$, but accounting for the influence of these offset values that is attributed to mirror tilt. Additionally, the interferometer systems may be used to incrementally measure mirror bow, according to methods known in the art, and these values can also be stored by the controller 40 to be combined with real time measurements to more accurately determine the position of the stage.

Further details of the components of the exposure apparatus 100 may be referenced from U.S. Pat. No. 5,528,118 to M. Lee, for example. The entire contents of U.S. Pat. No. 5,528,118 are hereby incorporated by reference thereto. It is to be understood that the invention is not limited to the exposure apparatus 100 described herein or to exposure systems for wafer processing. The general reference to the exposure apparatus 100 is purely for illustrating an embodiment in an environment in which the invention may be used.

It will be observed from the above description that the interferometer systems of the invention provide a number of advantages over prior art systems. Importantly, the interferometer systems account for displacement of the measurement mirrors due to a compound effect of mirror tilt and stage tilt, thus providing more accurate stage position measurement than possible with prior art interferometer systems.

What is claimed is:

1. A measurement system for determining the tilt of a reflective object mounted to a support, the system comprising:

first, second, third and fourth sensors, each capable of generating data indicative of a distance between the first, second, third or fourth sensor, respectively, and a reflective surface of the reflective object; and a controller for receiving inputs from the first, second, third and fourth sensors and determining a tilt of the reflective surface with respect to a z axis;

wherein:

the support has a generally planar surface that is generally perpendicular to the z axis but which may tilt with respect thereto, the reflective object is mounted to the support so that the reflective surface is in a plane substantially parallel with the z axis and longitudinally extends substantially parallel to an axis normal to the z axis;

the first and second sensors are aligned substantially parallel to the axis normal to the z axis along which the reflective surface extends longitudinally and are separated by a distance a;

the third and fourth sensors are aligned substantially parallel to the axis normal to the z axis along which the reflective surface extends longitudinally and are separated by the distance a;

the first and third sensors are aligned substantially parallel to the z axis and are separated by a distance b;

the second and fourth sensors are aligned substantially parallel to the z axis and are separated by the distance b; and the controller determines a tilt of the reflective surface at a location ka along the longitudinally extending direction of the reflective surface according to the following formula:

$$\Delta(ka) = \Phi((k1)a) - \Phi(ka)$$

where:

$\Delta(ka)$ is a measure of a displacement of the reflective surface out of the plane substantially parallel with the z axis, at location ka;

$\Phi(ka)$ is a measure of tilt of the reflective surface measured by the second an fourth sensors;

$\Phi((k1)a)$ is a measure of tilt of the reflective surface measured by the first an third sensors;

$\theta(x)$ is a measure of tilt of the support;

$s(x)$ is a measure of displacement, out of the plane substantially parallel with the z axis of the reflective surface when z=0;

$t(x)$ is a measure of displacement out of the plane substantially parallel with the z axis, of the reflective surface when z=−b;

$\delta(x)$ is a measure of displacement of the support along the x axis normal to the z axis;

a measurement value for the second sensor when the reflective surface is at a position y=ka is determined by L2 (ka)=s(ka)+δ(ka)−(b/2)θ(ka);

a measurement value for the fourth sensor when the reflective surface is at a position y=ka is determined by L4 (ka)=t(ka)+δ(ka)+(b/2)θ(ka);

a measurement value for the first sensor when the reflective surface is at a position y=ka is determined by L1 (ka)=s(ka+a)+δ(ka)−(b/2)θ(ka);

a measurement value for the third sensor when the reflective surface is at a position y=ka is determined by L3 (ka)=t(ka+a)+δ(ka)+(b/2)θ(ka);

Δ(ka)=J2(ka)−J1 (ka)=Φ((k+1)a)−Φ(ka), where J1 (ka)=(L4 (ka)−L2 (ka))/b =(t(ka)−s(ka))/b+θ(ka)=Φ (ka)+θ(ka), and J2(ka)=(L3 (ka)−L1 (ka))/b=(t((k1) a)−s((k+1)a))/b+θ(ka)=Φ((k+1)a)+θ(ka);

the reflective surface can be moved to a position y=ka+a along the y axis normal to the z axis along which the reflective surface extends longitudinally;

a measurement value for the second sensor when the reflective surface is at a position y=ka+a is determined by L2 (ka+a)=s(ka+a)+δ(ka+a)−(b/2)θ(ka+a);

a measurement value for the fourth sensor when the reflective surface is at a position y=ka+a is determined by L4 (ka+a)=t(ka+a)+δ(ka+a)+(b/2)θ(ka+a);

a measurement value for the first sensor when the reflective surface is at a position y=ka+a is determined by L1 (ka+a)=s(ka+a+a)+δ(ka+a)−(b/2)θ(ka+ a);

a measurement value for the third sensor when the reflective surface is at a position y=ka+a is determined by L3 (ka+a)=t(ka+a+a)δ(ka+a)+(b/2)θ(ka+ a);

Δ((k+1)a)=J2((k+1)a)−J1 ((k+1)a)=Φ((k+2)a)−Φ(k+1) a), where J1((k+1)a)=(L4 ((k+1)a)−L2 ((k+1)a))/b=

$(t((k+1)a)-s((k+1)a))/b+\theta((k+1)a) =\Phi(k+1)a)\theta((k+1)a)$, and $J2((k+1)a)=(L3\ ((k+1)a)-L1\ ((k+1a))/b=(t((k+2)a)-s((k+2)a))/b+\theta((k+1)a)=\Phi((k+2)a)\theta((k+1)a)$;

the reflective surface can be incrementally moved to additional positions in multiples of a along the axis normal to the z axis along which the reflective surface extends longitudinally and additional measurement values for the sensors can be determined to arrive at a set of measurement values $\{\Delta((k-1)a)= \Phi(ka)-\Phi((k-1)a);\ \Delta(k2)a)=\Phi((k-1)a)-\Phi((k-2)a);\ \ldots\ ;\ \Delta(0)=\Phi(a)-\Phi(0)\}$; and the controller determines a summation of the set of measurement values as $$\sum_{m=0}^{k-1}\Delta(ma)=\Phi(ka)-\Phi(0)$$

and a tilt of the reflective surface at a location ka along the longitudinally extending direction of the reflective surface as $$\Phi(ka)=\Phi(0)+\sum_{m=0}^{k-1}\Delta(ma);$$

the system further comprising at least one motor operatively mounted to said support to move said support, said reflective surface and said reflective object in the directions along which said reflective surface longitudinally extends, wherein said motor incrementally moves said reflective surface to measure displacement of said reflective surface out of said plane substantially parallel with the z axis at each incremental location.

2. The measurement system of claim 1, wherein the third and fourth sensors are aligned substantially parallel to the axis normal to the z axis along which the reflective surface extends longitudinally and are separated by a distance c.

3. The measurement system of claim 1, wherein the first, second, third and fourth sensors comprise first, second, third and fourth laser beams.

4. The measurement system of claim 3, wherein the first, second, third and fourth laser beams are incorporated into an interferometer system.

5. The measurement system of claim 2, wherein said first, second, third and fourth sensors comprise first, second, third and fourth laser beams; and wherein said fifth, sixth, seventh and eighth sensors comprise fifth, sixth, seventh and eighth laser beams.

6. The measurement system of claim 5, wherein said first, second, third and fourth laser beams are incorporated into a first interferometer system, and wherein said fifth, sixth, seventh and eighth laser beams are incorporated into a second inferometer system.

7. A interferometric measurement system for determining the tilt of a reflective object mounted to a support, said system comprising:

an interferometer system having first, second, third and fourth laser beam generators, each capable of generating a laser beam to measure a distance between said first, second, third or fourth generator, respectively, and a reflective surface mounted to a support; and a controller for receiving inputs from said interferometer system and determining a tilt of said reflective surface with respect to a z axis, wherein the support has a generally planar surface that is generally perpendicular to the z axis but which may tilt with respect thereto, and wherein the reflective surface is in a plane substantially parallel with the z axis and longitudinally extends substantially parallel to an axis normal to the z axis;

and wherein said controller determines a tilt of said reflective surface at a location ka along the longitudinally extending direction of said reflective surface according to the following formula:

$$\Delta(ka)=\Phi((k+1)a)-\Phi(ka)$$

where:

$\Delta(ka)$ is a measure of a displacement of said reflective surface out of said plane substantially parallel with the z axis, at location ka;

$\Phi(ka)$ is a measure of tilt of said reflective surface measured by said second and fourth laser beams;

$\Phi((k+1)a)$ is a measure of tilt of said reflective surface measured by said first and third laser beams;

$\theta(x)$ is a measure of tilt of the support;

$s(x)$ is a measure of displacement, out of the plane substantially parallel with the z axis of the reflective surface when z=0;

$t(x)$ is a measure of displacement, out of the plane substantially parallel with the z axis of the reflective surface when z=−1;

$\delta(x)$ is a measure of displacement of the support along the axis normal to the z axis;

a measurement value for the second laser beam when the reflective surface is at a position y=ka is determined by $L2\ (ka)=s(ka)+\delta(ka)-(a/2)\theta(ka)$;

a measurement value for the fourth laser beam when the reflective surface is at a position y=ka is determined by $L4\ (ka)=t(ka)+\delta(ka)+(a/2)\theta(ka)$;

a measurement value for the first laser beam when the reflective surface is at a position y=ka is determined by $L1\ (ka)=s(ka+a)+\delta(ka)-(a/2)\theta(ka)$;

a measurement value for the third laser beam when the reflective surface is at a position y=ka is determined by $L3\ (ka)=t(ka+a)+\delta(ka)+(a/2)\theta(ka)$;

$\Delta(ka)=J2(ka)-J1\ (ka)=\Phi((k+1)a)-\Phi(ka)$, where $J1\ (ka)=(L4\ (ka)-L2\ (ka))/b\ =(t(ka)-s(ka))/b+\theta(ka)=\Phi(ka)+\theta(ka)$, and $J2(ka)=(L3\ (ka)-L1\ (ka))/b=(t((k+1)a)-s((k1)a))/b+\theta(ka)=\Phi((k1)a)+\theta(ka)$;

the reflective surface can be moved to a position y=ka+a along the axis normal to the z axis along which the reflective surface extends longitudinally;

a measurement value for the second laser beam when the reflective surface is at a position y=ka+a is determined by $L2\ (ka+a)=s(ka+a)+\delta(ka+a)-(a/2)\theta(ka+a)$;

a measurement value for the fourth laser beam when the reflective surface is at a position y=ka+a is determined by $L4\ (ka+a)=t(ka+a)+\delta(ka+a)+(a/2)\theta(ka+a)$;

a measurement value for the first laser beam when the reflective surface is at a position y=ka+a is determined by $L1\ (ka+a)=s(ka+a+a)+\delta(ka+a)-(a/2)\theta(ka+a)$;

a measurement value for the third laser beam when the reflective surface is at a position y=ka+a is determined by $L3\ (ka+a)=t(ka+a+a)+\delta(ka+a)+(a/2)\theta(ka+a)$;

$\Delta((k+1)a)=J2((k+1)a)-J1\ ((k+1)a)=\Phi((k+2)a)-\Phi((k1)a)$, where $J1\ ((k+1)a)=(L4\ ((k1)a)-L2\ ((k+1)a))/b=(t((k+1)a)=s((k+1)a))/b\theta(k+1)a)=\Phi((k+1)a)+\theta((k+1)a)$, and $J2((k+1)a)=(L3\ ((K+1)a)-L1\ ((k+1)a))/b=(t((k+2)a)-s((k+2)a))/b+\theta((k+1)a)=\Phi((k+2)a)+\theta((k+1)a)$;

the reflective surface can be incrementally moved to additional positions in multiples of a along the axis normal to the z axis along which the reflective surface extends longitudinally and additional measurement values for the laser beams can be determined to arrive at a set of measurement values $\{\Delta((k-1)a)=\Phi(ka)-\Phi((k-1)a); \Delta((k-2)a)=\Phi((k-1)a)-\Phi((k-2)a); \ldots; \Delta(0)=\Phi(a)-\Phi(0)\}$; and the controller determines a summation of the set of measurement values as $$\sum_{m=0}^{k-1}\Delta(ma) = \Phi(ka) - \Phi(0)$$

and a tilt of the reflective surface at a location ka along the longitudinally extending direction of the reflective surface as $$\Phi(ka) = \Phi(0) + \sum_{m=0}^{k-1}\Delta(ma);$$

the system further comprising at least one motor operatively mounted to said support to move said support and said reflective surface in directions along which said reflective surface longitudinally extends, wherein said motor incrementally moves said reflective surface to measure displacement of said reflective surface out of said plane substantially parallel with the z axis at each incremental location.

8. The interferometric measurement system of claim 7, wherein said reflective surface comprises a first reflective surface; said inteferometric measurement system further comprising:

a second interferometer system having fifth, sixth, seventh and eighth laser beam generators, each capable of generating a laser beam to measure a distance between said fifth, sixth, seventh or eighth generator, respectively, and a second reflective surface of a second reflective object mounted to the support, said reflective surface comprising a second reflective surface;

wherein said controller receives inputs from said second interferometer system and determines a tilt of the second reflective surface with respect to the z axis, wherein the second reflective object is mounted to the support so that said second reflective surface is in a second plane substantially parallel with the z axis and longitudinally extends substantially parallel to an axis normal to the z axis and normal to the axis which said first reflective surface extends substantially parallel to;

and wherein said controller determines a tilt of said second reflective surface at a location ka along the longitudinally extending direction of said second reflective surface according to the following formula:

$$\Delta(ka)=\Phi((k+1)a)-\Phi(ka)$$

where:

$\Delta(ka)$ is a measure of a displacement of said second reflective surface out of said second plane substantially parallel with the z axis, at location ka;

$\Phi(ka)$ is a measure of tilt of said second reflective surface measured by said sixth and eighth laser beams;

$\Phi((k+1)a)$ is a measure of tilt of said second reflective surface measured by said fifth and seventh laser beams;

$\theta(y)$ is a measure of tilt of the support;

$s(y)$ is a measure of displacement, out of the plane substantially parallel with the z axis, of the second reflective surface when z=0;

$t(y)$ is a measure of displacement, out of the plane substantially parallel with the z axis, of the second reflective surface when z=−b;

$\delta(y)$ is a measure of displacement of the support along the axis normal to the z axis;

a measurement value for the sixth laser beam when the second reflective surface is at a position x=ka is determined by L6 $(ka)=s(ka)+\delta(ka)-(a/2)\theta(ka)$;

a measurement value for the eighth laser beam when the second reflective surface is at a position x=ka is determined by L8 $(ka)=t(ka)+\delta(ka)+(a/2)\theta(ka)$;

a measurement value for the fifth laser beam when the second reflective surface is at a position x=ka is determined by L5 $(ka)=s(ka+a)+\delta(ka)-(a/2)\theta(ka)$;

a measurement value for the seventh laser beam when the second reflective surface is at a position x=ka is determined by L7 $(ka)=t(ka+a)+\delta(ka)+(a/2)\theta(ka)$;

$\Delta(ka)=J2(ka)-J1$ $(ka)=\Phi((k+1)a)-\Phi(ka)$, where J1 $(ka)=(L8\ (ka)-L6\ (ka))/b=t(ka)-s(ka))/b+\theta(ka)=\Phi(ka)+\theta(ka)$, and $J2(ka)=(L7\ (ka)-L5\ (ka))/b=(t((k+1)a)-s((k+1)a))/b+\theta(ka)=\Phi((k+1)a)+\theta(ka)$;

the second reflective surface can be moved to a position y=ka+a along the axis normal to the z axis along which the second reflective surface extends longitudinally;

a measurement value for the sixth sensor when the second reflective surface is at a position x=ka+a is determined by L6 $(ka+a)=s(ka+a)+\delta(ka+a)-a/2)\theta(ka+a)$;

a measurement value for the eighth sensor when the second reflective surface is at a position x=ka+a is determined by L8 $(ka+a)=t(ka+a)+\delta(ka+a)+a/2)\theta(ka+a)$;

a measurement value for the fifth sensor when the second reflective surface is at a position x=ka+a is determined by L5 $(ka+a)=s(ka+a+a)+\delta(ka+a)-a/2)\theta(ka+a)$;

a measurement value for the seventh sensor when the second reflective surface is at a position x=ka+a is determined by L7 $(ka+a)=t(ka+a+a)+\delta(ka+a)+a/2)\theta(ka+a)$;

$\Delta((k+1)a)=J2(k+1)a)-J1\ (k+1)a)=\Phi((k+2)a)-\Phi((k+1)a)$, where J1 $((k+1)a)=(L8\ (k+1)a)-L6\ ((k+1)a))/b=(t((k+1)a)-s((k+1)a))/b+\theta((k+1)a)=\Phi((k+1)a)+\theta((k+1)a)$, and $J2((k+1)a)=(L7)((k+1)a)-(L5\ ((k+1)a))/b=(t((k+2)a)-s((k+2)a))/b+\theta((k+1)a)=\Phi((k+2)+\theta((k+1)a)$;

the second reflective surface can be incrementally moved to additional positions in multiples of a along the axis normal to the z axis along which the second reflective surface extends longitudinally and additional measurement values for the sensors can be determined to arrive at a set of measurement values $\{\Delta((k-1)a)=\Phi(ka)\ -\Phi(k-1)a); \Delta((k-2)a)=\Phi((k-1)a)-\Phi((k-2)a); \ldots; \Delta(0)=\Phi(a)-\Phi(0)\}$; and the controller determines a summation of the set of measurement values as $$\sum_{m=0}^{k-1}\Delta(ma) = \Phi(ka) - \Phi(0)$$

and a tilt of the second reflective surface at a location ka along the longitudinally extending direction of the second reflective surface as $$\Phi(ka) = \Phi(0) + \sum_{m=0}^{k-1} \Delta(ma).$$

9. A method of measuring the tilt of a substantially planar surface with respect to a vertical axis, comprising:

providing a measurement system having the capability of measuring distances between first, second, third and fourth adjacent pairs of locations on the substantially planar surface and respective first, second, third and fourth adjacent pairs of locations on the measurement system, where the distances measured are along imaginary lines substantially perpendicular to the substantially planar surface;

positioning the substantially planar surface such that the measurement system is near an end of the substantially planar surface;

measuring distances between the pairs of first, second, third and fourth locations;

subtracting the distance between the second locations from the distance between the fourth locations and dividing the difference by a distance between the second and fourth locations on the substantially planar surface to give a term J1;

subtracting the distance between the first locations from the distance between the third locations and dividing the difference by the distance between the first and third locations on the substantially planar surface to give a term J2; and determining a tilt of the substantially planar surface at the location of the substantially planar surface according to the following formula:

$$\Delta(ka)=J2(ka)-J1(ka)=\Phi((k+b\ 1)a)-\Phi(ka)$$

where:
$\Delta(ka)$ is a measure of a displacement out of the substantially planar surface;
$\Phi(ka)$ is a measure of tilt of the substantially planar surface with respect to the vertical axis measured between the second and fourth locations;
$\Phi((k+1))$ is a measure of tilt of the substantially planar surface with respect to the vertical axis measured between the first and third locations; and
a is a distance between the first and second locations on the substantially planar surface;

the method further comprising:

incrementally moving the substantially planar surface in a direction parallel to an axis normal to the vertical axis and away from the end of the surface by the distance a;

measuring distances between the first, second, third and fourth locations on the measurement system and the respective four new locations on the substantially planar surface;

subtracting the distance between the second locations from the distance between the fourth locations and dividing the difference by a distance between the second and fourth locations on the substantially planar surface to give a term J1;

subtracting the distance between the first locations from the distance between the third locations and dividing the difference by the distance between the first and third locations on the substantially planar surface to give a term J2; and determining a tilt of the substantially planar surface at the new location incrementally removed from a previously measured location according to the following formula:

$$\Delta(ka+a)=J2(ka+a)-J1(ka+a)=\Phi((k+2)a)-\Phi((k+1)a)$$

where:
$\Delta(ka+a)$ is a measure of a displacement out of the substantially planar surface;
$\Phi((k+1)a)$ is a measure of tilt of the substantially planar surface with respect to the vertical axis measured between the second and fourth locations on the measurement system and the new locations on the substantially planar surface; and
$\Phi((k+2)a)$ is a measure of tilt of the substantially planar surface with respect to the vertical axis measured between the first and third locations on the measurement system and the new locations on the substantially planar surface;

the method further comprising:

incrementally repeating the method until an opposite end of the substantially planar surface is reached and no further incremental measurements can be taken, or until a predetermined length of the substantially planar surface has been measured; and determining a tilt of the substantially planar surface with respect to the vertical axis for any predetermined position ka according to the following formula:

$$\Phi(ka) = \Phi(0) + \sum_{m=0}^{k-1} \Delta(ma)$$

where:
$\Phi(ka)$ is a measure of tilt of the substantially planar surface with respect to the vertical axis at position ka;
$\Phi(0)$ is a measure of tilt of said second reflective surface at an initial measurement location near one end of said second reflective surface; and
$\Delta(ma)$ is a measure of displacement out of said substantially planar surface, at locations where in =0, 1, 2, . . . k−1.

* * * * *

UNITED STATES PATENT AND TRADEMARK OFFICE
CERTIFICATE OF CORRECTION

PATENT NO. : 6,813,022 B2
DATED : November 2, 2004
INVENTOR(S) : Fuyuhiko Inoue

It is certified that error appears in the above-identified patent and that said Letters Patent is hereby corrected as shown below:

<u>Title page,</u>
Item [75], Inventor, "Kanagawa-ken," should read -- San Mateo, --.

<u>Column 14,</u>
Line 14, "$\Delta(ka)=\Phi((k1)a)-\Phi(ka)$" should read -- $\Delta(ka)=\Phi((k+1)a)-\Phi(ka)$ --.
Line 21, "an" should read -- and --.
Line 22, "$\Phi((kl)a)$" should read -- $\Phi((k+1)a)$ --.
Line 23, "an" should read -- and --.
Line 26, "axis of" should read -- axis, of --.
Line 28, "displacement out" should read -- displacement, out --.
Lines 45-46, "$J1(ka)=(L4(ka)-L2(ka))/b =(t(ka)-s(ka))/b+\theta(ka)=\Phi$" should read -- $J1(ka)\equiv(L4(ka)-L2(ka))/b=(t(ka)-s(ka))/b+\theta(ka)=\Phi$ --.
Line 47, "$J2(ka)=(L3(ka)-L1(ka))/b=(t((kl)$" should read -- $J2(ka)\equiv(L3(ka)-L1(ka))/b=(t((k+1)$ --.
Lines 64-65, "$(ka+a)=t(ka+a+a)\delta(ka+a)+(b/2)\theta(ka+a)$" should read -- $(ka+a)=t(ka+a+a)+\delta(ka+a)+(b/2)\theta(ka+a)$ --.
Line 66, "$\Delta((k+1)a)=J2((k+1)a)-J1((k+l)a)=\Phi((k+2)a)-\Phi(k+1)$" should read -- $\Delta((k+1)a)=J2((k+1)a)-J1((k+1)a)=\Phi((k+2)a)-\Phi((k+l)$ --.
Line 67, "$J1((k+1)a)=(L4((k4+1)a)-L2((k+1)a))/b=$" should read -- $J1((k+l)a)\equiv(L4((k+1)a)-L2((k+1)a))/b=$ --.

<u>Column 15,</u>
Line 1, "$(t((k+1)a)-s((k+1)a))/b+\theta((k+l)a)=\Phi(k+1)a)\theta((k+$" should read -- $(t((k+1)a)-s((k+1)a))/b+\theta((k+1)a)=\Phi((k+1)a)+\theta((k+$ --.
Line 2, "$J2((k+1)a)=(L3((k+1)a)-L1((k+1a))/b=(t$" should read -- $J2((k+1)a)\equiv(L3((k+1)a)-L1((k+1)a))/b=(t$ --.
Line 3, "$((k+2)a)-s((k+2)a))/b+\theta((k+1)a)=\Phi((k+2)a)\theta((k+1)$" should read -- $((k+2)a)-s((k+2)a))/b+\theta((k+1)a)=\Phi((k+2)a)+\theta((k+1)$ --.
Line 55, "inferometer" should read -- interferometer --.
Line 56, "A" should read -- An --.

UNITED STATES PATENT AND TRADEMARK OFFICE
CERTIFICATE OF CORRECTION

PATENT NO. : 6,813,022 B2
DATED : November 2, 2003
INVENTOR(S) : Fuyuhiko Inoue

It is certified that error appears in the above-identified patent and that said Letters Patent is hereby corrected as shown below:

Column 16,
Line 21, "axis of" should read -- axis, of --.
Line 24, "axis of" should read -- axis, of --.
Line 25, "z=-1;" should read -- z= -b; --.
Lines 39-40, "J1 (ka)=L4 (ka)-L2 (ka))/b =(t(ka)-s(ka))/b+θ (ka)=Φ" should read -- J1(ka)≡(L4(ka)-L2(ka))/b=(t(ka)-s(ka))/b+θ(ka)=Φ --.
Line 41, "J2(ka)=(L3 (ka)-L1 (ka))/b=(t((k+" should read -- J2(ka)≡(L3 (ka)-L1(ka))/b=(t((k+ --.
Line 42, "1)a)-s((kl)a))/b+θ(ka)=Φ((k1)a)+θ(ka);" should read -- 1)a)-s((k+1)a))/b+θ(ka)=Φ((k+1)a)+θ(ka); --.
Line 62, "Δ((k+1)a)=J2((k+1)a)-J1 ((k+1)a)=Φ((k+2)a)-Φ((k1)" should read -- Δ((k+1)a)=J2((k+1)a)-J1((k+1)a)=Φ)((k+2)a)-Φ((k+1) --.
Line 63, "J1 ((k+1)a)=(L4 ((k1)a)-L2 ((k+1)a))/b=" should read -- J1 ((k+1)a)≡(L4 ((k+1)a)-L2((k+1)a))/b= --.
Line 64, "(t((k+1)a=s((k+1)a))/bθ(k+1)a)=Φ((k+1)a)+θ((k+" should read -- (t((k+1)a=s ((k+1)a))/b+θ((k+1)a)=Φ((k+1)a)+θ((k+ --.
Line 65, "J2((k+1)a)=(L3 ((K+1)a)-L1 ((k+1)a))/b=" should read -- J2((k+1)a)≡(L3 ((k+1)a)-L1 ((k+1)a))/b= --.

Column 17,
Line 33, "inteferometric" should read -- interferometric --.

Column 18,
Lines 21-22, "J1 (ka)=(L8 (ka)-L6 (ka))/b=t(ka)-s(ka))/b+θ(ka)=Φ" should read -- J1(ka)≡(L8(ka)-L6(ka))/b=(t(ka)-s(ka))/b+θ(ka)=Φ --.
Line 23, "J2(ka)=(L7 (ka)-L5 (ka))/b=(t((k+" should read --J2(ka)≡(L7(ka)-L5(ka))/b=(t((k+ --.
Line 30, "L6 (ka+a)=s(ka+a)+δ(ka+a)-a/2)θ" should read -- L6(ka+a)=s(ka+a)+δ(ka+a)-(a/2)θ --.
Line 34, "L8 (ka+a)=t(ka+a)+δ(ka+a)+a/2)θ" should read -- L8(ka+a)=t(ka+a)+δ(ka+a)+(a/2)θ --.
Line 38, "L5 (ka+a)=s(ka+a+a) +δ(ka+a)-a/2)" should read -- L5(ka+a)=s(ka+a+a)+δ(ka+a)-(a/2) --.
Line 42, "L7 (ka+a)=t(ka+a+a)+δ(ka+a)+a/2)θ" should read -- L7(ka+a)=t(ka+a+a)+δ(ka+a)+(a/2)θ --.
Line 44, "Δ((k+1)a)=J2(k+1)a)-J1 (k+1)a)=Φ((k+2)a)-Φ((k+1)" should read -- Δ((k+1)a)=J2((k+1)a)-J1 ((k+1)a)=Φ((k+2)a)-Φ((k+1) --.
Line 45, "J1 ((k+1)a)=(L8 (k+1)a)-L6 ((k+1)a))/b" should read -- J1((k+1)a)≡(L8((k+1)a)-L6((k+1)a))/b --.
Line 47, "J2((k+1)a)=(L7)((k+1)a)-(L5 ((k+1)" should read -- J2((k+1)a)≡(L7((k+1)a)-L5((k+1) --.
Line 56, "{Δ((k-l)a)=Φ(ka) -Φ(k-1)a);" should read -- {Δ((k-1)a)=Φ(ka)-Φ((k-1)a); --.

UNITED STATES PATENT AND TRADEMARK OFFICE
CERTIFICATE OF CORRECTION

PATENT NO. : 6,813,022 B2
DATED : November 2, 2003
INVENTOR(S) : Fuyuhiko Inoue

It is certified that error appears in the above-identified patent and that said Letters Patent is hereby corrected as shown below:

Column 19,
Line 36, "$\Delta(ka)=J2(ka)-J1(ka)=\Phi((k+b\ 1\ )a)-\Phi(ka)$" should read -- $\Delta(ka)=J2(ka)-J1(ka)=\Phi((k+1)a)-\Phi(ka)$ --.
Line 44, "$\Phi((k+l)$" should read -- $\Phi((k+1)a)$ --.

Column 20,
Line 54, "in =0, 1," should read -- m=0, 1, --.

Signed and Sealed this

Thirty-first Day of May, 2005

JON W. DUDAS
*Director of the United States Patent and Trademark Office*